United States Patent [19]

Kim

[11] Patent Number: 5,479,466
[45] Date of Patent: Dec. 26, 1995

[54] ZIGZAG SCANNING ADDRESS GENERATOR AND METHOD THEREFOR

[75] Inventor: Bong-nam Kim, Bucheon, Rep. of Korea

[73] Assignee: Samsung Electronics Co., Ltd., Kyungki-Do, Rep. of Korea

[21] Appl. No.: 253,253

[22] Filed: Jun. 2, 1994

[30] Foreign Application Priority Data

Jun. 2, 1993 [KR] Rep. of Korea .................. 93-09910

[51] Int. Cl.⁶ .................................................. G06M 11/02
[52] U.S. Cl. .................... 377/10; 377/3; 377/45; 345/190; 345/200; 345/904
[58] Field of Search .................................. 345/190, 200, 345/904; 377/3, 10, 45; 327/291

[56] References Cited

U.S. PATENT DOCUMENTS 4,197,590 4/1980 Sukonick et al. .................. 364/900

5,386,233 1/1995 Keith .................................. 348/407

*Primary Examiner*—Margaret Rose Wambach
*Attorney, Agent, or Firm*—Sughrue, Mion, Zinn, Macpeak & Seas

[57] ABSTRACT

A zigzag scanning address generator includes a row address generator for generating a row address signal which stops, increases or decreases a present state in response to an enabling signal, and a column address generator for generating a column address signal which stops, increases or decreases a present state in response to the enabling signal. Therefore, the zigzag scanning address generator can generate zigzag scanning addresses according to a zigzag scanning method, simplifying the circuit configuration needed for generating the address signals corresponding to the zigzag scanning pattern.

16 Claims, 4 Drawing Sheets

ZIGZAG SCANNING ADDRESS GENERATOR AND METHOD THEREFOR

BACKGROUND OF THE INVENTION

1. Field of the Invention

The present invention relates to an address generator and, more particularly, to a zigzag scanning address generator for scanning in a zigzag pattern.

Korean Patent Application No. 93-09910 is incorporated herein by reference for all purposes.

2. Description of Related Art

A zigzag address scanning method can be adapted to video encoders for use in a video phone or video conferencing apparatus and to any ordinary video device for realizing a high quality picture. In particular, the method can be adapted to a video compressing method for high definition television (HDTV) systems using next-generation digital compression techniques.

During data transmission, video data compression is performed by, e.g., a discrete cosine transform (DCT) operation, by quantization or by variable-length coding. Among these methods, the DCT method produces coefficients which are generally concentrated in a low-frequency area after the DCT and attendant quantization operations are performed. Therefore, if the coefficients are sequentially arranged from a low-frequency area to a high frequency area, an irregular arrangement results, e.g., with the larger coefficient values occurring in the low-frequency area while the smaller coefficient values (close to zero) being concentrated in the high-frequency area.

In the DCT method, quantization coefficients which are sequentially arranged can be further categorized by scanning pattern, i.e., into an orthogonal scanning method and a zigzag scanning method. Although the DCT coefficients are concentrated in the low-frequency area, as described above, the orthogonal scanning method whereby sequential scanning is performed from the low-frequency area to the high-frequency area, performs data compression inefficiently. On the other hand, the zigzag scanning method, whereby scanning is performed in a zigzag pattern starting from the low-frequency area, in which large coefficient values are concentrated, permits transmission of large coefficient values intact but omits the zeroes occurring in high-frequency areas (where zeroes are frequently encountered) and transmits only the number of successive zeroes, thereby performing more effective data compression.

In FIG. 1, a $2^n \times 2^n$ block of on-screen video data is scanned in a specified order, i.e., in the order following the arrow marked with a dotted line. In other words, when the data is recorded to or read from the memory wherein $2^n \times 2^n$ on-screen video data is stored, the data is scanned in a zigzag order. When data is read from or recorded to the memory, the sequentially increasing address counter used in a conventional memory address-generator cannot be used to perform zigzag scanning.

For reasons of compression efficiency, the zigzag scanning method has been designated as one internationally standardized technique for digital video compression, e.g., adopted by the Joint Photographic Experts Group (JPEG) with respect to still video signal coding and, for telecommunication system video compression, specified as international standard method H.261. However, in spite of its inherent advantages, the zigzag scanning method is still not generally used due to inconveniences in its implementation.

SUMMARY OF THE INVENTION

The principal object of the present invention is to provide a zigzag scanning address generator permitting zigzag scanning, by which signal compression and restoration are performed, in response to a quantized digital video signal and a variable-length-decoded video signal.

Another object of the present invention is to provide a zigzag scanning address generator having simplified circuit configuration.

These and other objects, features and advantages according to the present invention are provided by a zigzag scanning address generator including a row address generator for generating a row address signal which stops, increases or decreases from a present state in response to an enabling signal, and a column address generator for generating a column address signal which stops, increases or decreases from the present state in response to the enabling signal.

These and other objects, features and advantages of the invention are disclosed in or apparent from the following description of preferred embodiments.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Table 1 illustrates the generation of the zigzag scanning addresses according to the present invention.

TABLE 1

| ORDER | ROW ADDRESS | COLUMN ADDRESS |
|---|---|---|
| 1 | 0 | 0 |
| 2 | 0 | 1 |
| 3 | 1 | 0 |
| 4 | 2 | 0 |
| 5 | 1 | 1 |
| . | . | . |
| . | . | . |
| . | . | . |
| $2^n \times 2^n - 1$ | $2^n - 1$ | $2^n - 2$ |
| $2^n \times 2^n$ | $2^n - 1$ | $2^n - 1$ |

Figure 1:
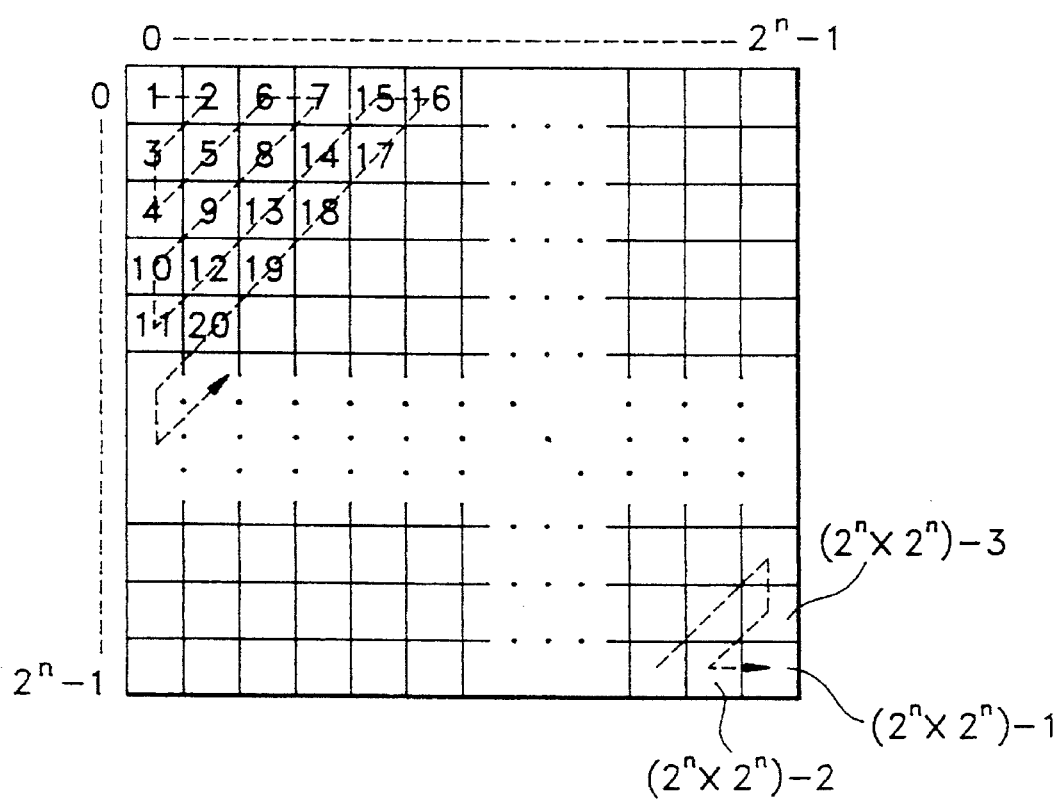
FIG. 1 is an illustration which is useful in understanding zigzag scanning and the generation of zigzag scanning addresses.

In Table 1, the 1st address of FIG. 1 corresponds to row address 0 and column address 0. Further, the 2nd address corresponds to row address 0 and column address 1, and continues accordingly so that, finally, the $(2^n \times 2^n)$th address corresponds to row address $2^n - 1$ and column address $2^n - 1$. Preferably, the row address of an address is the upper bit and the column address is the lower bit.

Figure 2A:
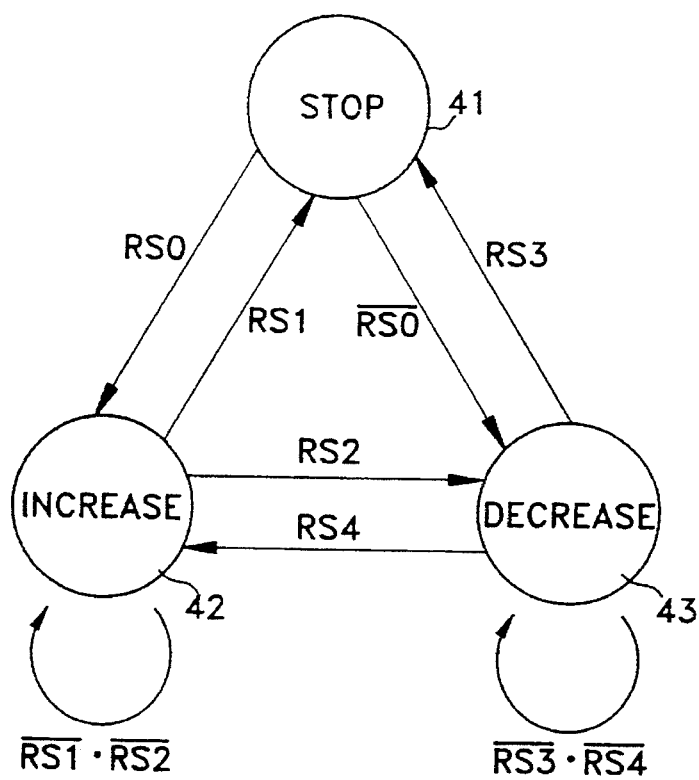
FIG. 2A is a state diagram showing the state conversion of the row addresses of Table 1.

FIG. 2A is a state diagram for illustrating the state conversion of the row addresses of Table 1. In FIG. 2A, no address change in a next state is represented by a stop state 41, an address increase in the next state is represented by an increase state 42, and an address decrease in the next state is represented by a decrease state 43. In other words, referring to Table 1, since there is no address change from the 1st address to the 2nd address with respect to row (upper bit), this condition is called a stop state. However, since the address increases by one from the 2nd address to the 3rd address, an increase state exists. When the address decreases by one from the 4th address to the 5th address, a decrease state exists.

That is to say, if the RS0 condition is satisfied, i.e., the row address is 0 or column address is $2^n-2$, the row address undergoes an increase in state, which is represented by the transition RS0 from stop state 41 to increase state 42. If the RS0 condition is not satisfied, the address undergoes a decrease in state, which is represented by the transition $\overline{RS0}$ from stop state 41 to decrease state 43. If the RS1 condition is satisfied, i.e., the row address is $2^n-2$ or $2^n-1$, the address stops increasing, which is represented by the transition RS1 from increase state 42 to stop state 41. When the RS2 condition is satisfied, i.e., column address is 0, the address undergoes decrease state 43 from an increase state 42, which is represented as transition RS2 from the state of increase to the state of decrease. If neither RS1 nor RS2 conditions are satisfied ($\overline{RS1}\cdot\overline{RS2}$), the address is held at increase state 42, as indicated by the curved arrow. If the RS3 condition is satisfied, i.e., row address is 1, the address stops decreasing, which is represented by the transition RS3 from decrease state 43 to stop state 41. If the RS4 condition is satisfied, i.e., the column address is $2^n-1$ or $2^n-2$, the address turns into an increase state 42 from a decrease state 43 which is represented as transition RS4 from the state of decrease to the state of increase. If neither RS3 nor RS4 conditions are satisfied ($\overline{RS3}\cdot\overline{RS4}$), the address is held at decrease state 43, as indicated by the curved arrow.

Figure 2B:
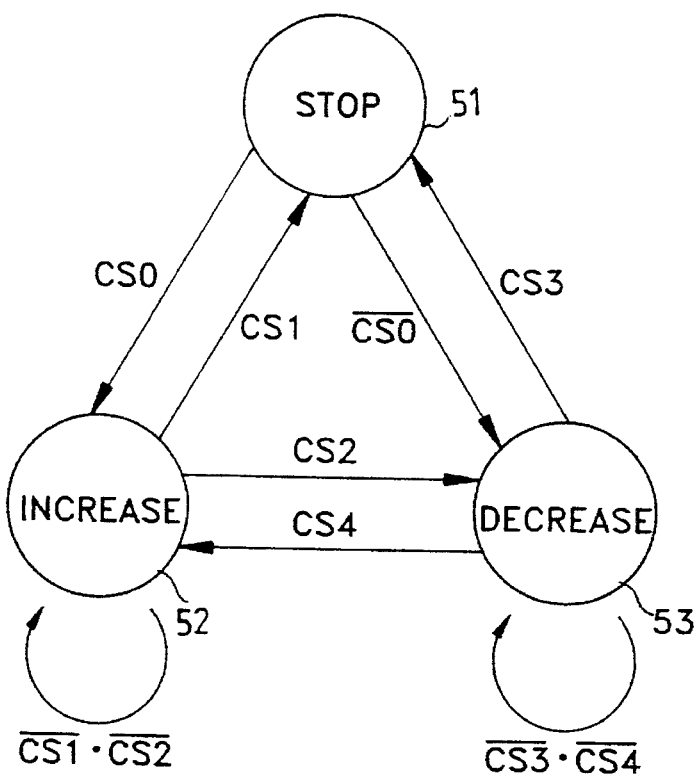
FIG. 2B is a state diagram showing the state conversion of the column addresses of Table 1.

FIG. 2B is a state diagram for illustrating the state conversion of the column addresses of Table 1, wherein no address change in a next state is represented by a stop state 51, an address increase in the next state is represented by an increase state 52, and an address decrease in the next state is represented by a decrease state 53. As shown in Table 1, since the address increases by one from the 1st address to the 2nd address, an increase state exists, and since the address decreases by one from the 2nd address to the 3rd address, a decrease state exists. However, as there is no address change from the 3rd address to the 4th address with respect to column (lower bit), this condition is called a stop state.

For example, if the CS0 condition is satisfied, i.e., column address is 0, the address undergoes an increase in state, which is represented by the transition CS0 from stop state 51 to increase state 52. If the CS0 condition is not satisfied, the address undergoes a decrease in state, which is represented by the transition $\overline{CS0}$ from stop state 51 to decrease state 53. If the CS1 condition is satisfied, i.e., the column address is $2^n-2$ and row address is not 0 nor $2^n-1$, the address stops increasing, which is represented by the transition CS1 from increase state 52 to stop state 51. If the CS2 condition is satisfied, i.e., column address is 0, the address turns into a decrease state 53 from an increase state 52, which is represented as transition CS2 from the state of increase to the state of decrease. If neither the CS1 nor the CS2 condition is satisfied ($\overline{CS1}\cdot\overline{CS2}$), the address is held at increase state 52 as indicated by the curved arrow. If the CS3 condition is satisfied, i.e., column address is 1 and row address is not $2^n-2$, the address stops decreasing, which is represented by the transition CS3 from decrease state 53 to stop state 51. If the CS4 condition is satisfied, i.e., row address is $2^n-2$, the address turns into an increase state 52 from a decrease state 53 which is represented as transition CS4 from the state of decrease to the state of increase. If neither the CS3 nor the CS4 condition is satisfied ($\overline{CS3}\cdot\overline{CS4}$), the address is held at decrease state 53 as indicated by the curved arrow.

Table 2A is a state transition table of the row addresses according to the state diagram shown in FIG. 2A.

TABLE 2A

| PRESENT STATE | RS0 | RS1 | RS2 | RS3 | RS4 | NEXT STATE |
|---|---|---|---|---|---|---|
| 0 0 | 1 | X | X | X | X | 1 0 |
| 0 0 | 0 | X | X | X | X | 0 1 |
| 1 0 | X | 0 | 0 | X | X | 1 0 |
| 1 0 | X | 1 | 0 | X | X | 0 0 |
| 1 0 | X | 0 | 1 | X | X | 0 1 |
| 0 1 | X | X | X | 0 | 0 | 0 1 |
| 0 1 | X | X | X | 1 | 0 | 0 0 |
| 0 1 | X | X | X | 0 | 1 | 1 0 |

It will be appreciated that X represents a "don't care" condition, "1" is true and "0" is false.

In Table 2A, for a present state of "0 0" and given that RS0 is 1 and RS1, RS2, RS3 and RS4 are all X, the row address is increased by one, since the address makes the transition from a stop state 41 to an increase state 42, as can be seen by the state diagram of FIG. 2A, and the next state becomes "1 0." Referring further to Table 2A, for a present state of "1 0" and given that RS1 and RS2 are both 0 and RS0, RS3 and RS4 are all X, the original state is maintained, i.e., stays at "1 0," since the address state is held at increase state 42. Likewise, for a present state of "0 1" and given that RS0, RS1 and RS2 are all X and RS3 and RS4 are both 0, the original state is maintained since the address state is held at decrease state 43. That is to say, the next state is still "0 1."

Table 2B is a state transition table of the column addresses according to the state diagram shown in FIG. 2B.

TABLE 2B

| PRESENT STATE | CS0 | CS1 | CS2 | CS3 | CS4 | NEXT STATE |
|---|---|---|---|---|---|---|
| 0 0 | 1 | X | X | X | X | 1 0 |
| 0 0 | 0 | X | X | X | X | 0 1 |
| 1 0 | X | 0 | 0 | X | X | 1 0 |
| 1 0 | X | 1 | 0 | X | X | 0 0 |
| 1 0 | X | 0 | 1 | X | X | 0 1 |
| 0 1 | X | X | X | 0 | 0 | 0 1 |
| 0 1 | X | X | X | 1 | 0 | 0 0 |
| 0 1 | X | X | X | 0 | 1 | 1 0 |

It will also be readily appreciated that the symbol X is indicative of a "don't care" condition In Table 2B, for a present state of "0 0" and given that CS0 is 1 and CS1, CS2, CS3 and CS4 are all X, the column address is increased by one since the address makes a transition from a stop state 51 to an increase state 52, as can be seen by the state diagram of FIG. 2B, and the next state becomes "1 0." Referring further to Table 2B, for a present state of "1 0" and given that CS1 and CS2 are both 0 and CS0, CS3 and CS4 are all X, the original state is maintained, i.e., stays at "1 0," since the address is held at increased state 52. Likewise, for a present state of "0 1" and given that CS0, CS1 and CS2 are all X and CS3 and CS4 are both 0, the original state is maintained since the address is held at decrease state 53. That is to say, the next state is still "0 1".

Figure 3:
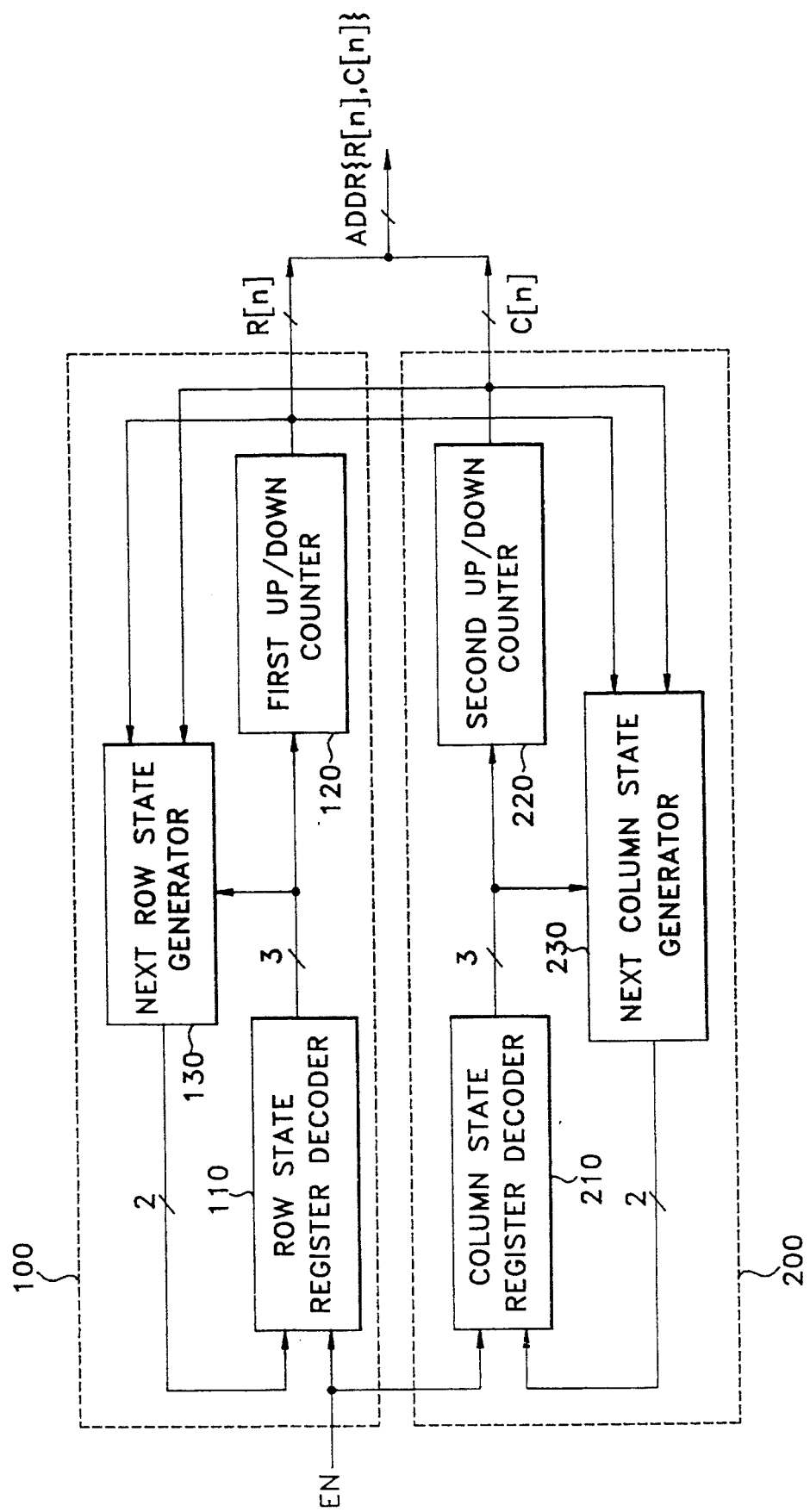
FIG. 3 is a high level block diagram of the zigzag scanning address generator according to the present invention.

FIG. 3 is a block diagram of the zigzag scanning address generator according to the present invention, wherein the zigzag scanning address generator includes a row address generator 100, enabled by an enabling signal EN, for generating row addresses, and a column address generator 200, also enabled by enabling signal EN, for generating column addresses. Preferably, row address generator 100 includes a row state register decoder 110, a next row state generator 130, and a first up/down counter 120, while column address generator 200 advantageously includes a column state register decoder 210, a next column state generator 230, and a second up/down counter 220.

Preferably, row state register decoder 110 receives a predetermined enabling signal, e.g., EN, as its input to thereby start data compression or restoration, and lo outputs control signals for the stop, increase and decrease states to the next row state generator 130 and the first up/down counter 120 by means of an internal 2-bit register. The first up/down counter 120 maintains its counted value when the present row state signal indicates a stop state, increases its counted value by one if a valid increase state signal is received, and decreases the counted value by one if a valid decrease state signal is received. Preferably, the 3-bit data generated by first up/down counter 120 is both used for the memory address and is transmitted to the next row state generator 130 for use in generating the next row state. The next row state generator 130 receives three inputs including a present row state signal and the output signals of first and second up/down counters 120 and 220 to thereby generate the next row state according to the transition condition as described in greater detail above.

It will be appreciated that the operation of the column address generator 200 is the same as that of the row address generator 100.

As described above, 2n-bit addresses ADDR{R[n],C[n]} advantageously can be generated by setting n-bit row address R[n] according to upper bits and n-bit column address C[n] according to lower bits, respectively.

Figure 4:
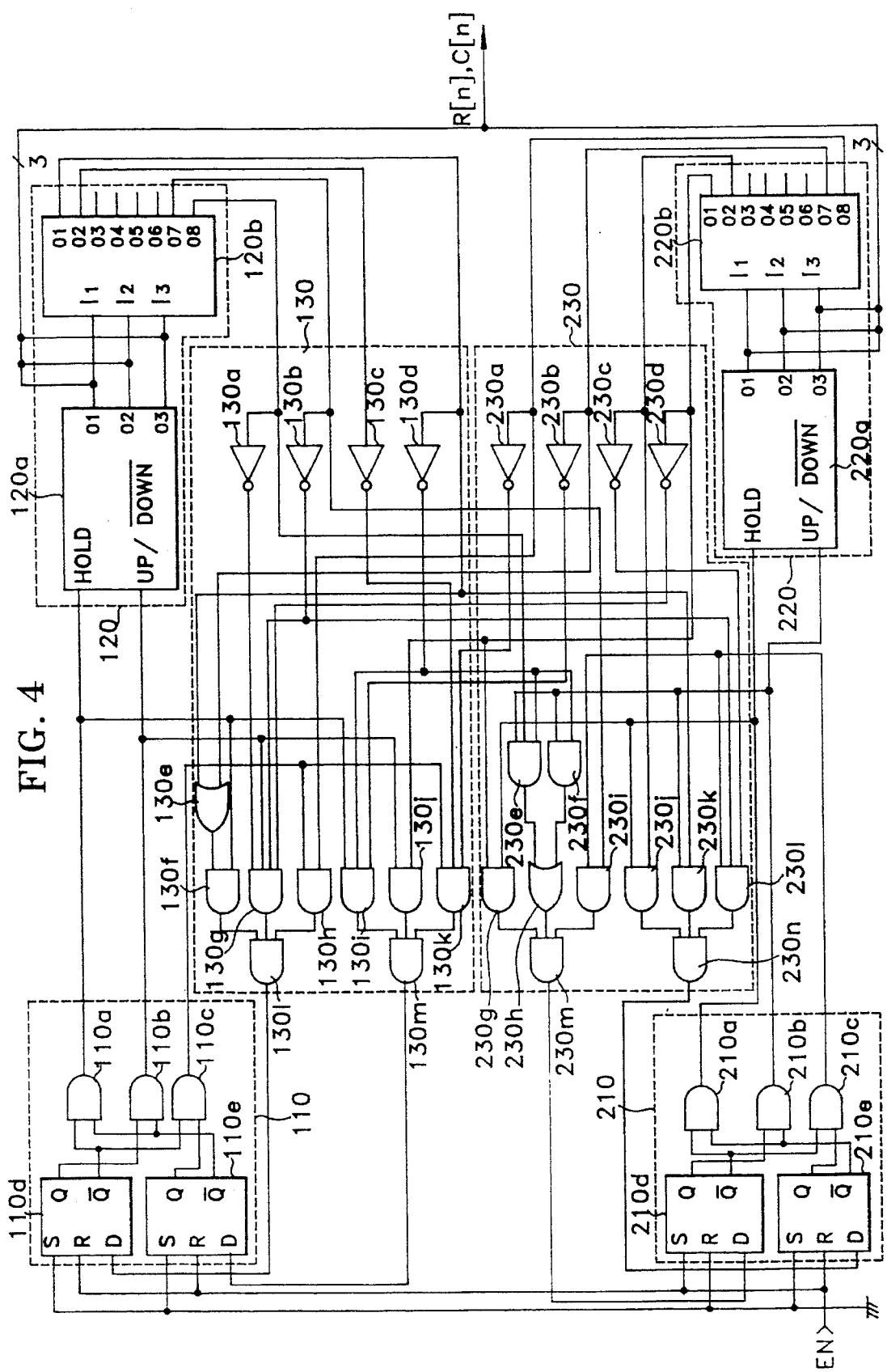
FIG. 4 is a circuit diagram of an exemplary preferred embodiment of the zigzag scanning address generator shown in FIG. 3.

FIG. 4 is a detailed circuit diagram of a preferred embodiment of the zigzag scanning address generator according to the present invention, wherein the row state register decoder 110 includes D type flip-flops 110d and 110e, each having a reset terminal to which enabling signal EN is applied and a set terminal connected to ground, an AND gate 110a for performing an AND-operation with respect to the inverted outputs of D flip-flops 110d and 110e, an AND gate 110b for performing an AND-operation with respect to the Q output of D flip-flop 110d and inverted output of D flip-flop 110e, and an AND gate 110c for performing an AND-operation with respect to the inverted output of D flip-flop 110d and the Q output of D flip-flop 110e.

The column state register decoder 210 includes a D flip-flop 210d whose set terminal is supplied with enabling signal EN and whose reset terminal is connected to ground, a D flip-flop 210e whose reset terminal is supplied with enabling signal EN and whose set terminal is connected to ground, an AND gate 210a for performing an AND-operation with respect to the inverted outputs of D flip-flops 210d and 210e, an AND gate 210b for performing an AND-operation with respect to the Q output of D flip-flop 210d and the inverted output of D flip-flop 210e, and an AND gate 210c for performing an AND-operation with respect to the inverted output of D flip-flop 210d and the Q output of D flip-flop 210e.

The first up/down counter 120 includes an up/down counter 120a for generating 3-bit row addresses using a hold port to which the output of AND gate 110a is applied and an up/down coefficient control port to which the output of AND gate 110b is applied, and a decoder 120b for decoding the output signal of the up/down counter 120a.

The second up/down counter 220 includes an up/down counter 220a for generating 3-bit column addresses using a hold port to which the output of AND gate 210a is applied and an up/down coefficient control port to which the output of AND gate 210b is applied, and a decoder 220b for decoding the output signal of the up/down counter 220a.

The next row state generator 130 includes inverters 130a, 130b, 130c and 130d for inverting the eighth, seventh, second and first output signals of the decoder 120b, respectively, an OR gate 130e for performing an OR-operation with respect to the first output signal of decoder 120b and the seventh output signal of decoder 220b, an AND gate 130f for performing an AND-operation with respect to the outputs of OR gate 130e and AND gate 110a, an AND gate 130g for performing an AND-operation with respect to the outputs of AND gate 110b and inverters 130a and 130b and the inversion of the first output signal of decoder 220b, an AND gate 130h for performing an AND-operation with respect to the output of AND gate 110c and the eighth output signal of decoder 220b, an AND gate 130i for performing an AND-operation with respect to the output signals of the AND gate 110a, the inverters 130d and 230b, an AND gate 130j for performing an AND-operation with respect to the AND gate 110a and the first output signal of the decoder 220b, an AND gate 130k for performing an AND-operation of the output signals of the AND gate 110c and the inverter 130c and the inverted signal of the eighth output signal of the decoder 220b, an OR gate 130l for performing an OR-operation of the output signals of the AND gates 130f, 130g and 130h, and an OR gate 130m for performing an OR-operation on the output signals of the AND gates 130i, 130j and 130k.

The next column state generator 230 includes an AND gate 230e for performing an AND-operation of the output signals of the AND gate 210b and inverter 130d and the eighth output signal of the decoder 120b, an AND gate 230f for performing an AND-operation of the output signals of the AND gate 210b, inverter 230b and inverter 130d, an AND gate 230g for performing an AND-operation of the first output signal of the decoder 120b and the output signal of the AND gate 210a, an OR gate 230h for performing an OR-operation of the output signals of the AND gates 230e and 230f, an AND gate 230i for performing an AND-operation of the output signal of the AND gate 210c and the seventh output signals of the decoder 120b, an AND gate 230j for performing an AND-operation of the output signal of the AND gate 210a and the second output signals of the decoder 120b, an AND gate 230k for performing an AND-operation of the output signal of the AND gate 210b and the first output signal of the decoder 120b, an AND gate 230l for performing an AND-operation of the output signals of the AND gate 210c, inverter 130b and inverter 230c, an OR gate 230m for performing an OR-operation of the output signals of the AND gates 230g and 230i and OR gate 230h, and an OR gate 230n for performing an OR-operation of the output signals of the AND gates 210j, 230k and 230l.

The operation according to the above configuration will now be described.

With the input of a logic high enabling signal EN, the output states of D flip-flops 110*d* and 110*e* become "00" and the output states of D flip-flops 210*d* and 210*e* become "10". That is, the row state becomes a "STOP" state as shown in FIG. 2A, and the column state becomes an "INCREASE" state as shown FIG. 2B. At this time, the outputs of the first and second up/down counters 120 and 220 are reset, and the 01 outputs of the decoder 120*b* and 220*b* are both "1", while the other outputs are all "0". The resultant address outputs R[n] and C[n] becomes "00000". Then, the outputs of the OR gates 130*l* and 130*m* are "1" and "0", respectively, and the outputs of OR gates 230*m* and 230*n* are "0" and "1", respectively. Next, with the input of logic high enabling signal EN, the output states of D flip-flops 110*d* and 110*e* become "10" and the output states of D flip-flops 210*d* and 210 become "01". That is, the row state becomes an "INCREASE" state as shown in FIG. 2A, and the column state becomes a "DECREASE" state as shown in FIG. 2B.

At this time, the output of counter 120*a* is maintained, the output of counter 220*a* becomes "001", and the O2 output of decoder 220*a* becomes "1", while the other outputs of the decoder 220*a* are all "0". The resultant address outputs R[n] and C[n] becomes "000001". Accordingly, the outputs of OR gates 130*l* and 130*m* become "1" and "0", respectively, and the outputs of OR gates 210*d* and 210*e* become "0" and "0", respectively. Next, with the input of a logic high enabling signal EN, the output states of D flip-flops 110*d* and 110*e* become "10" and the output states of D flip-flops 210*d* and 210*e* become "00". That is, the row state becomes an "INCREASE" state as shown in FIG. 2A, and the column state becomes "STOP" state as shown in FIG. 2B. Thus, the output of counter 120*a* becomes "001" and the output of the counter 220*a* becomes "000". That is, the resultant address output becomes "001000".

In the present invention, n represents the number of bits, and in the above embodiment, n equals three. However, for larger values of n, the same circuit configuration can advantageously be used by merely increasing the size of the corresponding register.

During the operation, the states are changed according to the row and column state tables. The row and column addresses have a new state or maintain the previous state every clock pulse, according to the diagrams of FIGS. 2A and 2B.

It should be obvious to one skilled in the art that other embodiments of the present invention can be performed by scanning data from a memory using a zigzag scanning method at the time of decoding the data, as is the case with the above-described technique.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A zigzag scanning address generator, comprising:

row address generating means for generating a row address signal corresponding to a predetermined scanning pattern which stops, increases and decreases from a present state in response to an enabling signal; and column address generating means for generating a column address signal corresponding to said scanning pattern which stops, increases and decreases from a present state in response to said enabling signal.

2. The zigzag scanning address generator as claimed in claim 1, wherein said scanning pattern is a zigzag scanning pattern.

3. A zigzag scanning address generator comprising:

row address generating means for generating a row address signal which stops, increases and decreases from a present state in response to an enabling signal;

column address generating means for generating a column address signal which stops, increases and decreases from a present state in response to said enabling signal.

4. The zigzag scanning address generator as claimed in claim 3, wherein said row address generating means comprises:

row state storing and decoding means for responding to said enabling signal by receiving a next row state signal and thereby decoding said next row state signal;

row up/down counting means for up/down-counting an output signal of said row state storing and decoding means in response thereto, and generating a row address signal; and next row state generating means for generating a next row state signal by receiving an output signal of said row state storing and decoding means, output signal of said row up/down counting means, and the column address signals.

5. The zigzag scanning address generator as claimed in claim 4, wherein said row state storing and decoding means comprises:

first and second flip-flops having a reset port reset by said enabling signal and a set port connected to ground, for respectively receiving respective output signal of said next row state generating means at data input ports thereto;

first AND-operating means for performing an AND-operation with respect to inverted output signals of said first and second flip-flops;

second AND-operating means for performing an AND-operation with respect to an output signal of said first flip-flop and an inverted output signal of said second flip-flop; and third AND-operating means for performing an AND-operation with respect to said inverted output signal of said first flip-flop and an output signal of said second flip-flop.

6. The zigzag scanning address generator as claimed in claim 5, wherein said row up/down counting means comprises:

a row up/down counter for counting an output signal of said second AND-operating means in response thereto, having a hold port which receives an output signal of said first AND-operating means and an up/down port which receives an output signal of said second AND-operating means, to thereby generate a 3-bit row address signal; and a first decoder for decoding said row address signal of said row up/down counter.

7. The zigzag scanning address generator as claimed in claim 6, wherein said column address generating means comprises:

column state storing and decoding means for responding to said enabling signal, receiving a next column state signal and thereby decoding said next column state signal;

column up/down counting means for up/down-counting an output signal of said column state storing and decoding means in response thereto and generating a column address signal; and next column state generating means for generating a next column state signal by receiving said output signal of said column state storing and decoding means and an output signal of said column up/down counting means and row address signal.

8. The zigzag scanning address generator as claimed in claim 7, wherein said column state storing and decoding means comprises:

a third flip-flop for receiving a first output signal of said next row state generating means at a data input port thereto, with its set port being set by said enabling signal and its reset port being connected to ground;

a fourth flip-flop for receiving a second output signal of said next row state generating means at the data input port thereto, with its reset port being reset by said enabling signal and its set port being to ground;

fourth AND-operating means for performing an AND-operation with respect to respective inverted output signals of said third and fourth flip-flops;

fifth AND-operating means for performing an AND-operation with respect to an output signal of said third flip-flop and an inverted output signal of said fourth flip-flop; and sixth AND-operating means for performing an AND-operation with respect to said inverted output signal of said third flip-flop and an output signal of said fourth flip-flop.

9. The zigzag scanning address generator as claimed in claim 8, wherein said column up/down counting means comprises:

a column up/down counter for counting the output signal of said second AND-operating means in response thereto, having a hold port which receives the output signal of said first AND-operating means and an up/down port which receives the output signal of said second AND-operating means, to thereby generate a 3-bit column address signal; and a second decoder for decoding said column address signal of said second up/down counter.

10. A zigzag scanning address generator comprising:

row address generating means for generating row address signal which stops, increases and decreases a present state in response to an enabling signal, said row address generating means comprising:

row state storing and decoding means for responding to said enabling signal by receiving a next row state signal and thereby decoding said next row state signal, said row state storing and decoding means including:

first and second flip-flops having a reset port reset by said enabling signal and a set port connected to ground, for respectively receiving the output signal of said next row state generator to the data input ports thereto;

first AND-operating means for performing an AND-operation with respect to the inverted output signals of said first and second flip-flops;

second AND-operating means for performing an AND-operation with respect to the output signal of said first flip-flop and the inverted output signal of said second flip-flop; and third AND-operating means for performing an AND-operation with respect to the inverted output signal of said first flip-flop and the output signal of said second flip-flop;

row up/down counting means for up/down-counting the output signal of said row state storing and decoding means in response thereto, and generating a row address signal, said row up/down counting means comprising:

a row up/down counter for counting the output signal of said second AND-operating means in response thereto, having a hold port which receives the output signal of said first AND-operating means and an up/down port which receives the output signal of said second AND-operating means, to thereby generate a 3-bit row address signal; and a row decoder for decoding the output signal of said row up/down counter; and next row state generating means for generating a next row state signal by receiving output signals of said row state storing and decoding means, the output signals of said row up/down counting means, and the column address signals; and column address generating means for generating column address signal which stops, increases and decreases a present state in response to said enabling signal, said column address generating means comprising:

column state storing and decoding means for responding to said enabling signal, receiving a next column state signal and thereby decoding said next column state signal, said column state storing and decoding means comprises:

a third flip-flop for receiving a first output signal of said next row state generator at the data input port thereto, with its set port being set by said enabling signal and its reset port being connected to ground;

a fourth flip-flop for receiving a second output signal of said next row state generator at the data input port thereto, with its reset port being reset by said enabling signal and its set port being to ground;

fourth AND-operating means for performing an AND-operation with respect to the inverted output signals of said third and fourth flip-flops;

fifth AND-operating means for performing an AND-operation with respect to the output signal of said third flip-flop and the inverted output signal of said fourth flip-flop; and sixth AND-operating means for performing an AND-operation with respect to the inverted output signal of said third flip-flop and the output signal of said fourth flip-flop;

column up/down counting means for up/down-counting the output signal of said column state storing and decoding means in response thereto and generating a column address signal, said column up/down counting means comprising:

a column up/down counter for counting the output signal of said second AND-operating means in response thereto, having a hold port which receives the output signal of said first AND-operating means and an up/down port which receives the output signal of said second AND-operating means, to thereby generate a 3-bit column address signal; and a column decoder for decoding the output signal of said column up/down counter; and next column state generating means for generating a next column state signal by receiving the output signal of said column state storing and decoding means and the output signals of said column up/down counting means and column address signals.

11. The zigzag scanning address generator as claimed in claim 10, wherein said next row state generating means comprises:

first, second, third and fourth inverters for inverting associated eighth, seventh, second and first output signals of said row decoder, respectively;

first OR-operating means for performing an OR-operation with respect to the first output signal of said row decoder and the seventh output signal of said column decoder;

seventh AND-operating means for performing an AND-operation with respect to an output signal of said first OR-operating means and an output signal of said first AND-operating means;

eighth AND-operating means for performing an AND-operation with respect to an output signals of said second AND-operating means and first and second inverters and the inverted signal of said first output signal of said column decoder;

ninth AND-operating means for performing an AND-operation of the output signal of said third AND-operating means and the eighth output signal of said column decoder;

tenth AND-operating means for performing an AND-operation of the output signals of said first AND-operating means and said fourth inverter and an inverted seventh output signal of said column decoder;

eleventh AND-operating means for performing an AND-operation of said first AND-operating means and a first output signal of said column decoder;

twelfth AND-operating means for performing an AND-operation of the output signals of said third AND-operating means and said third inverter and an inverted eighth output signal of said column decoder;

second OR-operating means for performing an OR-operation of respective output signals of said seventh, eighth and ninth AND-operating means; and third OR-operating means for performing an OR-operation of respective output signals of said tenth, eleventh and twelfth AND-operating means.

12. The zigzag scanning address generator as claimed in claim 11, wherein said next column state generating means comprises:

fifth, sixth, seventh and eighth inverters for inverting associated eighth, seventh, second and first output signals of said column decoder, respectively;

thirteenth AND-operating means for performing an AND-operation on respective output signals of said fifth AND-operating means and said fourth inverter and an eighth output signal of said row decoder;

fourteenth AND-operating means for performing an AND-operation of respective output signals of said fifth AND-operating means and said fourth and said sixth inverters;

fifteenth AND-operating means for performing an AND-operation of a first output signal of said column decoder and output signal of said fourth AND-operating means;

fifth OR-operating means for performing an OR-operation of respective output signals of said thirteenth and fourteenth AND-operating means;

sixteenth AND-operating means for performing an AND-operation of an output signal of said sixth AND-operating means and the seventh output signal of said row decoder;

seventeenth AND-operating means for performing an AND-operation of an output signal of said fourth AND-operating means and a second output signal of said column decoder;

eighteenth AND-operating means for performing an AND-operation of an output signal of said fifth AND-operating means and a first row output signal of said row decoder;

nineteenth AND-operating means for performing an AND-operation of respective output signals of said sixth AND-operating means, and said second and said seventh inverters;

sixth OR-operating means for performing an OR-operation of respective output signals of said fifteenth and sixteenth AND-operating means and said fifth OR-operating means; and seventh OR-operating means for performing an OR-operation of respective output signals of said seventeenth, eighteenth and nineteenth AND-operating means.

13. The zigzag scanning address generator as claimed in claim 10, wherein said next column state generating means comprises:

first, second, third and fourth inverters for inverting associated eighth, seventh, second and first output signals of said column decoder, respectively;

seventh AND-operating means for performing an AND-operation of respective output signals of said fifth AND-operating means an inverted one of a first output signal and an eighth output signal of said row decoder;

eighth AND-operating means for performing an AND-operation of respective output signals of said fifth AND-operating means, said second inverter and said inverted first output signal;

ninth AND-operating means for performing an AND-operation of respective first output signal of said column decoder and an output signal of said fourth AND-operating means;

first OR-operating means for performing an OR-operation of respective output signals of said seventh and eighth AND-operating means;

tenth AND-operating means for performing an AND-operation of respective output signal of said sixth AND-operating means and a seventh output signal of said row decoder;

eleventh AND-operating means for performing an AND-operation of respective output signal of said fourth AND-operating means and a second output signal of said column decoder;

twelfth AND-operating means for performing an AND-operation of an output signal of said fifth AND-operating means and a first output signal of said row decoder;

thirteenth AND-operating means for performing an AND-operation of respective output signals of said sixth AND-operating means, said third inverters and an inverted said seventh output signal of said row decoder;

second OR-operating means for performing an OR-operation of respective output signals of said ninth and tenth AND-operating means and said first OR-operating means; and third OR-operating means for performing an OR-operation of respective output signals of said eleventh, twelfth and thirteenth AND-operating means.

14. A method for generating addresses defining a zigzag scanning pattern, said method comprising steps for:

(a) generating a row address signal which stops, increases and decreases a from present state in response to an enabling signal;

(b) generating a column address signal which stops, increases and decreases from a present state in response to said enabling signal.

15. The method as recited in claim 14, wherein said step (a) comprises the steps of:

(c) receiving a next row state signal responsive to said enabling signal;

(d) decoding said next row state signal responsive to said enabling signal to thereby generate an output decoded signal;

(e) up/down-counting said decoded signal in response thereto to thereby generate said row address signal; and (f) generating a next row state signal in response to said decoded signal, said row address signal and said column address signals.

16. The method as recited in claim 14, wherein said step (b) comprises the steps of:

(g) receiving a next column state signal responsive to said enabling signal;

(h) decoding said next column state signal responsive to said enabling signal to thereby generate an output decoded signal;

(i) up/down-counting said decoded signal in response thereto to thereby generate said column address signal; and (j) generating a next column state signal in response to said decoded signal, said column address signal and said row address signals.

\* \* \* \* \*